(12) United States Patent
Liang et al.

(10) Patent No.: US 8,618,524 B2
(45) Date of Patent: *Dec. 31, 2013

(54) PHASE CHANGE MEMORY WITH VARIOUS GRAIN SIZES

(75) Inventors: Chun-Sheng Liang, Puyan (TW);
Tzyh-Cheang Lee, Hsin-Chu (TW);
Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 129 days.

This patent is subject to a terminal disclaimer.

(21) Appl. No.: 13/029,436

(22) Filed: Feb. 17, 2011

(65) Prior Publication Data

US 2011/0140066 A1    Jun. 16, 2011

Related U.S. Application Data

(63) Continuation of application No. 11/858,712, filed on Sep. 20, 2007, now Pat. No. 7,893,420.

(51) Int. Cl.
*H01L 45/00*   (2006.01)
(52) U.S. Cl.
USPC ................ 257/4; 257/2; 257/E45.002
(58) Field of Classification Search
CPC ................ G11C 13/0004; H01L 45/06
USPC .......................... 257/3, 4, E45.002
See application file for complete search history.

(56) References Cited

U.S. PATENT DOCUMENTS

| | | | |
|---|---|---|---|
| 6,566,700 B2 | 5/2003 | Xu | |
| 7,023,014 B2 | 4/2006 | Morimoto et al. | |
| 2006/0113520 A1* | 6/2006 | Yamamoto et al. | 257/3 |
| 2006/0281217 A1 | 12/2006 | Hideki et al. | |
| 2007/0075347 A1 | 4/2007 | Lai et al. | |
| 2007/0215853 A1* | 9/2007 | Park et al. | 257/4 |
| 2008/0096344 A1 | 4/2008 | Lai et al. | |
| 2008/0258128 A1 | 10/2008 | Kuh et al. | |

OTHER PUBLICATIONS

Cai, Y.-F., et al., "Nitrogen and Silicon Co-Doping of $Ge_2Sb_2Te_5$ Thin Films for Improving Phase Change Memory Performance," Chin. Phys. Lett., vol. 24, No. 3, Chinese Physical Society and IOP Publishing Ltd., 2007, (pp. 781-783).

Friedrich, I., et al., "Structural Transformations of $Ge_2Sb_2Te_5$ Films Studied by Electrical Resistance Measurements," Journal of Applied Physics, vol. 87, No. 9, American Institute of Physics, May 1, 2000, (pp. 4130-4134).

Horii, H., et al., "A Novel Cell Technology Using N-doped GeSbTe Films for Phase Change RAM," 2003 Symposium on VLSI Technology Digest of Technical Papers, 2003, (2 pages).

(Continued)

*Primary Examiner* — Jerome Jackson, Jr.
*Assistant Examiner* — Paul Budd
(74) *Attorney, Agent, or Firm* — Slater & Matsil, L.L.P.

(57) ABSTRACT

A memory device includes a phase change element, which further includes a first phase change layer having a first grain size; and a second phase change layer over the first phase change layer. The first and the second phase change layers are depth-wise regions of the phase change element. The second phase change layer has a second average grain size different from the first average grain size.

18 Claims, 8 Drawing Sheets

(56) References Cited

OTHER PUBLICATIONS

Hwang, Y.N., et al., "Writing Current Reduction for High-density Phase-change RAM," International Electron Devices Meeting, IEEE, 2003, (pp. 893-896).

Park, J.B., et al., "Phase-Change Behavior of Stoichiometric $Ge_2Sb_2Te_5$ in Phase-Change Random Access Memory," Journal of the Electrochemical Society, vol. 154, No. 3, 2007, (pp. H139-H-141).

Yin, Y., et al., "Finite Element Analysis of Dependence of Programming Characteristics of Phase-Change Memory on Material Properties of Chalcogenides," Japanese Journal of Applied Physics, vol. 45, No. 11, The Japan Society of Applied Physics, 2006, (pp. 8600-8603).

* cited by examiner

PHASE CHANGE MEMORY WITH VARIOUS GRAIN SIZES

This application is a continuation of and claims the priority benefit of U.S. patent application Ser. No. 11/858,712, filed on Sep. 20, 2007, and entitled "Phase Change Memory with Various Grain Sizes," which application is hereby incorporated herein by reference.

TECHNICAL FIELD

This invention relates generally to phase change memories, and more particularly to methods for improving the program reliability of phase change memories.

BACKGROUND

Phase change technology is promising for next generation memories. It uses chalcogenide semiconductors for storing states. The chalcogenide semiconductors with phase change capability have a crystalline state and an amorphous state. In the crystalline state, the phase change materials have low resistivities, while in the amorphous state they have high resistivities. The resistivity ratios of the phase change materials in the amorphous and crystalline states are typically greater than 1000, and thus the resulting memory devices are unlikely to have errors for reading states. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase change random access memory (PRAM).

Some phase change materials, such as Ge—Sb—Te alloys, may have three possible structures, amorphous structure, face-centered cubic (FCC) structure, and hexagonal close packed (HCP) structure. Amorphous phase has high resistivities, HCP phase has low resistivities, while FCC phase has resistivities between the amorphous phase and the HCP phase. Typically, an amorphous phase change material may be transformed to the FCC phase change material at about 150° C., while transforming an amorphous phase or a FCC phase to HCP phase requires about 360° C. or higher. Since the typical back end of processes require about 400° C., the resulting phase change materials in phase change memories, as fabricated, are likely to be at the HCP state.

Since HCP phase change materials have low resistivities, the reset current for the very first reset operation (initial reset operation) after the fabrication needs to be very high. In the subsequent operations, the phases of phase change materials are typically switched between the amorphous state and the FCC state. Therefore, the subsequent reset operations may be performed with smaller reset currents. However, the integrated circuits for providing reset currents need to support the initial reset operation by providing high reset currents, although the subsequent reset operations may only need smaller program currents. This is a serious issue for device operation. The reset current and also the difference between initial and subsequent reset must be reduced.

To make things worse, since there are process variations in forming the heaters for heating the phase change materials, different phase change memory cells may need different reset currents even if they are in a same chip. Clearly, the initial reset currents need to be high enough for resetting all phase change memory cells. This further demands even higher initial reset currents, and hence putting a higher requirement to the integrated circuits for providing the reset currents. In addition, power consumption is unnecessarily increased for non-initial reset operations due to higher-than-necessary reset currents. New phase change memories and methods for forming the same are thus needed.

SUMMARY OF THE INVENTION

In accordance with one aspect of the present invention, A memory device includes a phase change element, which further includes a first phase change layer having a first grain size; and a second phase change layer over the first phase change layer. The first and the second phase change layers are depth-wise regions of the phase change element. The second phase change layer has a second average grain size different from the first average grain size.

In accordance with another aspect of the present invention, memory device includes a semiconductor substrate; a heater overlying the semiconductor substrate; and a phase change element over the semiconductor substrate. The phase change element is divided into at least two substantially horizontal sub layers including a first sub layer adjoining the heater, wherein the first sub layer has a first average grain size; and a second sub layer having a portion overlapping the first sub layer, wherein the second sub layer has a second average grain size greater than the first average grain size.

In accordance with yet another aspect of the present invention, a memory device includes a semiconductor substrate having at least one active device formed thereon; a dielectric layer over the semiconductor substrate; a heater in the dielectric layer; a fine-grain crystalline phase change layer over the heater; a coarse-grain crystalline phase change layer over the fine-grain crystalline phase change layer; and a top conductive layer over the coarse-grain crystalline phase change layer.

In accordance with yet another aspect of the present invention, a memory device includes a semiconductor substrate; a conductive feature over the semiconductor substrate; a dielectric layer over the conductive feature; a trench in the dielectric layer, wherein the conductive feature has at least a portion exposed through the trench; and a phase change element over the semiconductor substrate. The phase change element is divided into at least two substantially horizontal sub layers including a first sub layer substantially limited to the trench, wherein the first sub layer has a first average grain size; and a second sub layer over the dielectric layer and the first sub layer, wherein the second sub layer has a second average grain size greater than the first average grain size.

In accordance with yet another aspect of the present invention, a method for forming a memory device includes providing a substrate; depositing a first phase change layer over the substrate, wherein the first phase change layer has a first average grain size; and depositing a second phase change layer over the first phase change layer, wherein the second phase change layer has a second average grain size different from the first grain size.

In accordance with yet another aspect of the present invention, a method for forming a memory device includes providing a substrate; forming a heater over the substrate; depositing a first phase change layer over and adjoining the heater using first process conditions; and depositing a second phase change layer using second process conditions different from the first process conditions. The second phase change layer is over the first phase change layer, and the first and the second phase change layers are sub layers of a contiguous phase change layer.

The advantageous features of the present invention include reduced initial reset current, and reduced difference between the initial reset current, and subsequent reset currents.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1 through 9B are cross-sectional views of intermediate stages in the manufacturing of phase change memories.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel phase change memory and the methods of forming the same are provided. The intermediate stages of manufacturing preferred embodiments of the present invention are illustrated. The variations of the preferred embodiments are then discussed. Throughout the various views and illustrative embodiments of the present invention, like reference numbers are used to designate like elements.

Figure 1:
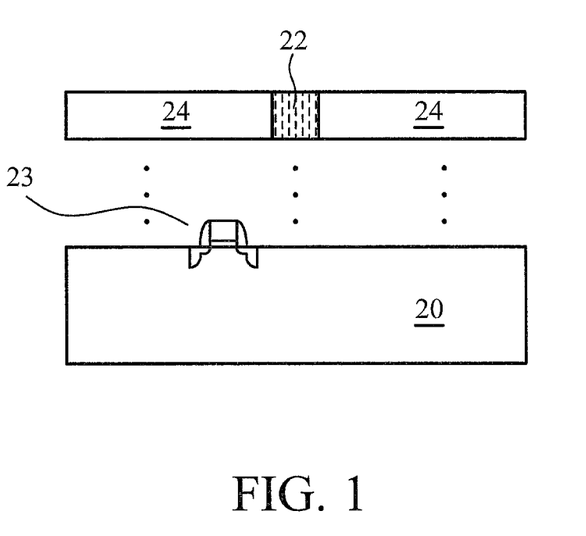

Referring to FIG. 1, conductive plug 22 is formed in dielectric layer 24, which is further formed over semiconductor substrate 20. Semiconductor devices such as transistors (symbolized using transistor 23) are formed at the surface of semiconductor substrate 20. Conductive plug 22 may be formed of tungsten, aluminum, copper, silver, and combinations thereof, and is electrically connected to the semiconductor devices. Dielectric layer 24 may be an inter-layer dielectric (ILD) or an inter-metal dielectric (IMD), and may be formed of materials having low k values, for example, with k values less than about 3.9. Conductive plug 22 may be formed by forming an opening in dielectric layer 24, filling the opening with a conductive material, and performing a chemical mechanical polish (CMP) to remove excess conductive material. For simplicity, semiconductor substrate 20 is not shown in subsequent drawings.

Figure 2:
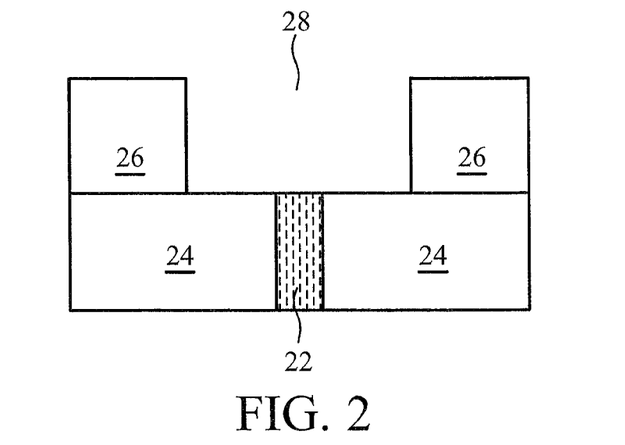

In FIG. 2, crown oxide 26 is formed on dielectric layer 24, followed by forming opening 28 to expose the underlying conductive plug 22. Crown oxide 26 may be formed of essentially the same materials as low-k dielectric layer 24, or other commonly known dielectric materials such as oxide, nitrides, oxynitrides, carbides, and the like.

Figure 3:
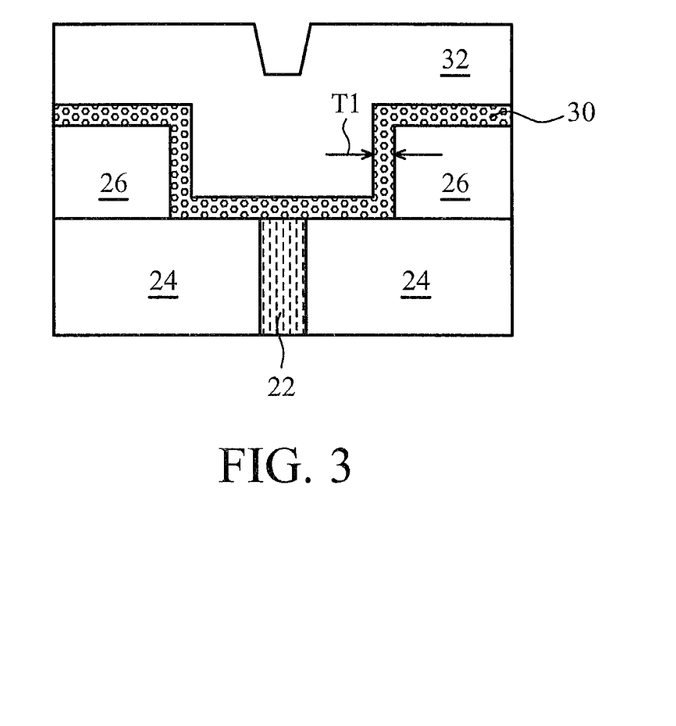

Heater layer 30 is then blanket formed, followed by the formation of dielectric layer 32, as is shown in FIG. 3. The materials in heater layer 30 may include conductive materials such as polysilicon, TiSiC, C, TiW, SiC, Ti, Ta, V, W, Cr, Fe, Ni, Nb, Pd, Pt, Zr, Mo, Cu, Al, Ag, Au, Hf, and alloys thereof. Alternatively, metal nitrides such as TiN, TaN, TiSiN, TiAlN, TiCN, TaSiN, MoN, TaAlN, and WN, metal silicides such as TiSix, NiSix, CoSix, conductive oxides such as $IrO_2$, $RuO_2$, $SrRuO_3$, $LaNiO_3$, and combinations thereof, can be used. In order to reduce the contact area between the subsequently formed heater and phase change layer, heater layer 30 is preferably thin, for example, with thickness T1 less than about 200 Å. Dielectric layer 32 preferably fully fills opening 28.

Figure 4:
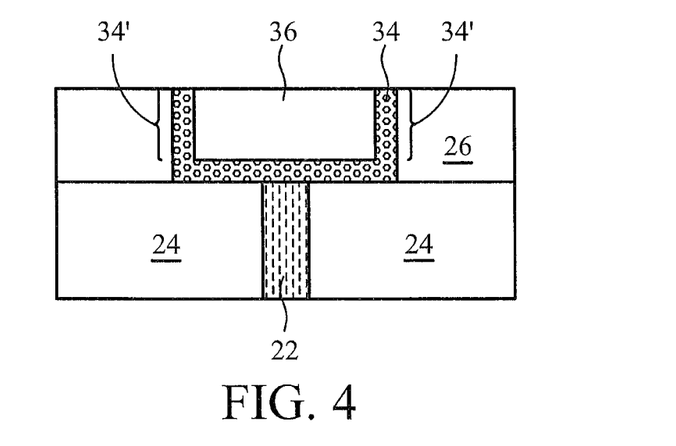
Figure 5:
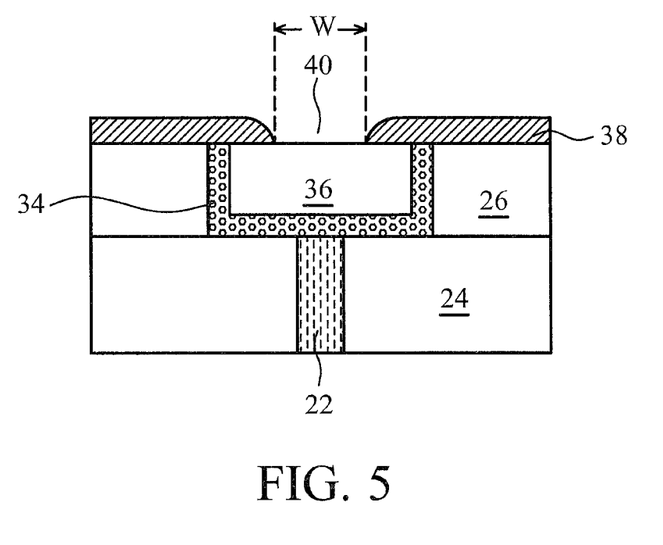

Referring to FIG. 4, a planarization is performed to remove excess heater layer 30 and dielectric layer 32. As a result, dielectric region 36 is left in an inner region encircled by heater 34, and the edges 34' of heater 34 form a ring encircling dielectric region 36. Next, as is shown in FIG. 5, dielectric layer 38 is formed and patterned, forming trench 40 therein. Through trench 40, a portion of dielectric region 36 and at least one edge 34' of heater 34 is exposed (refer to FIG. 6B). The width W of trench 40 is preferably small, for example, less than about 500 Å.

Figure 6A:
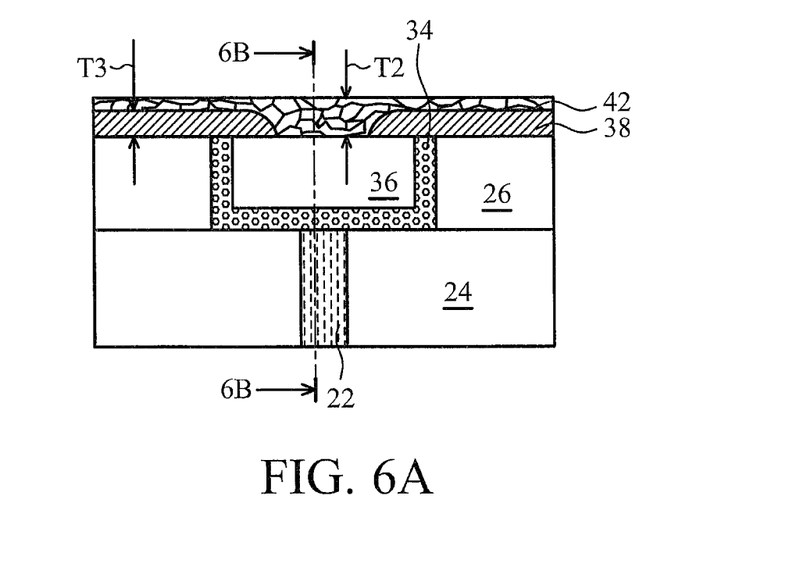

In FIG. 6A, fine-grain phase change layer 42 is formed to fill trench 40. In the preferred embodiment, fine-grain phase change layer 42 is formed of GeSbTe (GST). Alternatively, fine-grain phase change layer 42 may include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, and combinations thereof. As is known in the art, phase change materials have a crystalline state with a low resistivity, and an amorphous state with a high resistivity. Preferably, thickness T2 of fine-grain phase change layer 42 is greater than thickness T3 of dielectric layer 38. More preferably, thickness T2 is greater than the thickness of the active region in the subsequently formed phase change element, wherein the active region is where phase change occurs. In an exemplary embodiment, thickness T2 is between about 200 Å and about 800 Å. Presumably, the active region includes a portion of fine-grain phase change layer 42 adjoining heater 34.

Fine-grain phase change layer 42 may have an average grain size of between about 3 nm and about 10 nm, although it may have different values. The smaller the grain size, the higher the resistivity and transition temperature to HCP phase. The optimum grain size depends on the preferred initial reset current (the very first reset current applied on the phase change memory cell after its operation), and the lower the desirable initial reset current, the smaller grain size is preferred.

In an embodiment, the average grain size of fine-grain phase change layer 42 is adjusted by adding impurities, such as nitrogen, oxygen, silicon, and combinations thereof, during its formation. Alternatively, dielectrics, for example, oxides such as silicon oxide and/or germanium oxide, nitrides such as silicon nitride and/or germanium nitride, and oxynitrides such as silicon oxynitride, and/or germanium oxynitride may be added. The formation of fine-grain phase change layer 42 may be performed using reactive sputtering, co-sputtering, chemical vapor deposition, atomic layer deposition, and the like. In an exemplary embodiment, a co-sputtering uses a GST target and a silicon target to dope silicon into fine-grain phase change layer 42. The addition of oxygen may be achieved by using oxygen-containing gases or using oxide targets.

Preferably, if nitrogen, oxygen, and/or silicon are doped, the atomic percentage of the dopants is between about 2% and 25%, while if dielectrics are incorporated, the mole percentage of the dielectrics may be between about 3% and 20%. It is realized that when more dopants or dielectrics are doped, the average grain size of fine-grain phase change layer 42 is reduced, causing a decrease in grain size and an increase in the resistivity. Accordingly, the reset current is reduced. The crystalline phase is stabilized, and the difference between the initial reset current and subsequent reset currents is reduced.

Alternatively, fine-grain phase change layer 42 is formed by adjusting the deposition temperature. Reducing deposition temperatures cause the average grain sizes to be smaller. Conversely, increasing deposition temperatures causes the average grain sizes to be greater. In an exemplary embodiment, the deposition of fine-grain phase change layer 42 is performed at a temperature of less than about 250° C.

Figure 6B:
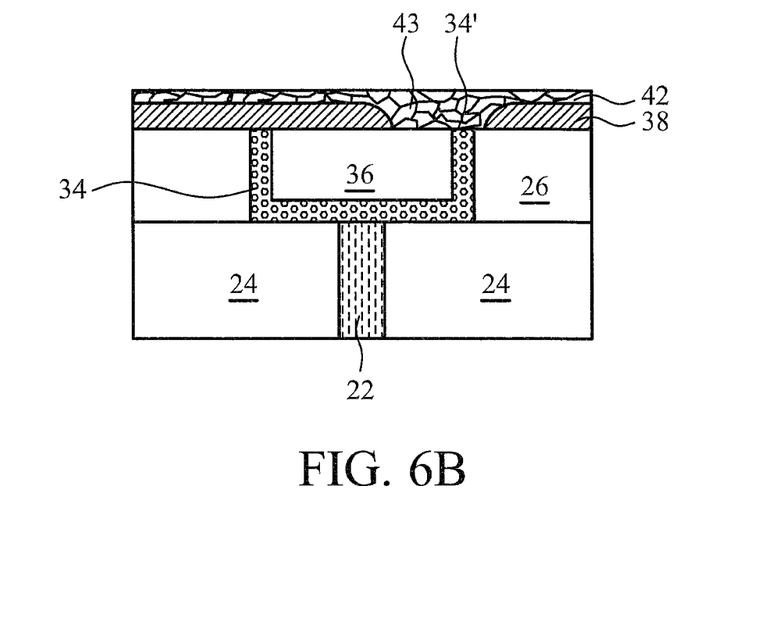

FIG. 6B shows a cross-sectional view of the structure shown in FIG. 6A, wherein the cross-sectional view is taken along a plane crossing line 6B-6B in FIG. 6A. It indicates that the portion of fine-grain phase change layer 42 formed in trench opening 40 (refer to FIG. 5) is in contact with the top edge of heater 34, wherein the active region 43 will be the portion of fine-grain phase change layer 42 adjoining the corresponding interface. Preferably, after reset operations, active region 43 becomes amorphous. Optionally, fine-grain phase change layer 42 may extend to the left and contact both edges of heater 34, although this scheme causes an increase in the contact area between heater 34 and fine-grain phase change layer 42.

Figure 6C:
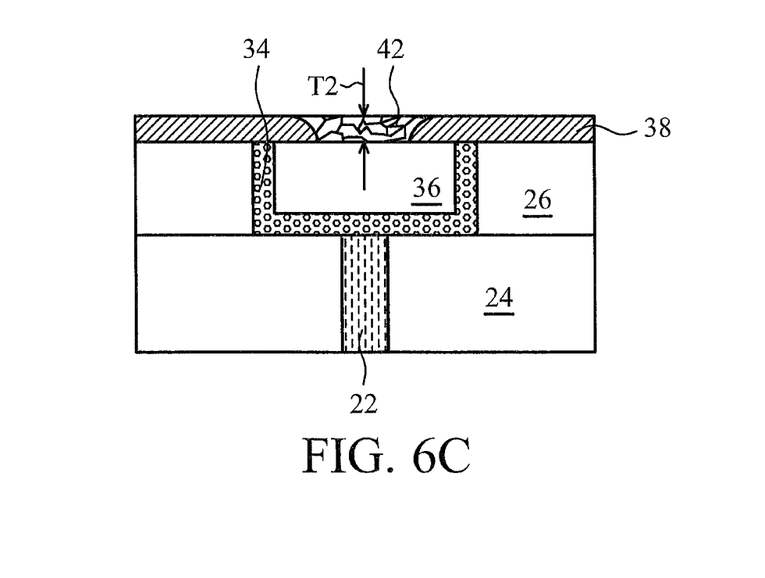

FIG. 6C illustrates an optional CMP step to level the top surfaces of fine-grain phase change layer 42 and dielectric layer 38. In this embodiment, thickness T2 of the remaining portion of fine-grain phase change layer 42 is preferably greater than about 150 Å, or at least greater than the thickness of the resulting active region.

Figure 7:
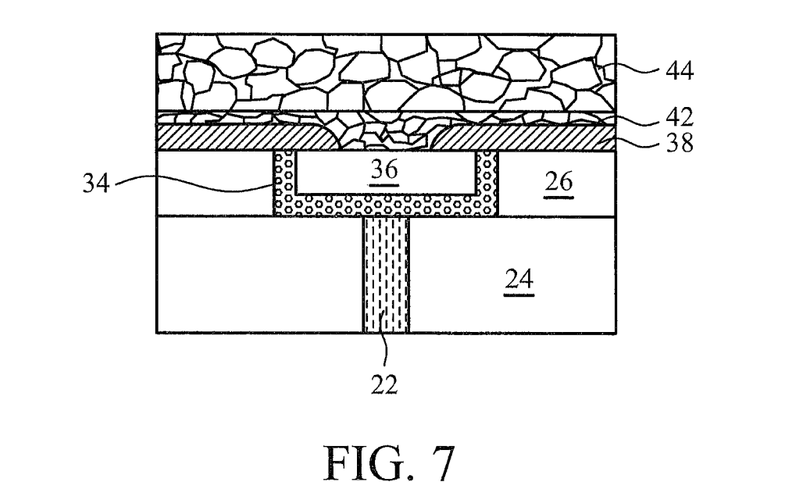

Next, as shown in FIG. 7, the formation process is changed to form coarse-grain phase change layer 44, which has a greater average grain size than that of fine-grain phase change layer 42. Preferably, a ratio of the average grain size of coarse-grain phase change layer 44 to the average grain size of fine-grain phase change layer 42 is greater than about two. In an exemplary embodiment, the average grain size of coarse-grain phase change layer 44 is between about 6 nm and about 20 nm. Coarse-grain phase change layer 44 preferably has a thickness greater than about 200 Å. Fine-grain phase change layer 42 and coarse-grain phase change layer 44 are preferably formed of a same phase change material, although they can be formed of different materials. Throughout the description, phase change layers 42 and 44 are referred to as depthwise regions due to the fact that they are formed layer by layer, and hence are at different depths of the respective wafer.

Similar to what is discussed in the preceding paragraphs, the grain size of coarse-grain phase change layer 44 may be adjusted by adding dopants, such as nitrogen, oxygen, silicon, and dielectrics including oxides, nitrides, oxynitrides, and the like. The percentage of the dopants in coarse-grain phase change layer 44 is thus accordingly less than in fine-grain phase change layer 42. Alternatively, the average grain size of coarse-grain phase change layer 44 is increased by increasing deposition temperatures, and exemplary deposition temperatures are greater than about 300° C. Experimental data has revealed that with deposition temperatures of less than about 250° C. and greater than about 300° C., the resistivities of fine-grain phase change layer 42 and coarse-grain phase change layer 44 (which are both formed of GST) may have desirable values.

In the preferred embodiment, the formations of coarse-grain phase change layer 44 and fine-grain phase change layer 42 are in-situ performed, preferably without vacuum break. In an embodiment, after fine-grain phase change layer 42 is formed, the process conditions are changed to the process conditions for forming coarse-grain phase change layer 44, and then the deposition is started again. As a result, phase change layers 42 and 44 have a relatively abrupt interface. Alternatively, the deposition continues during the gradual transition of the process conditions, and thus the deposited phase change materials gradually changes from fine grain to coarse grain. Naturally, even if the process conditions are abruptly changed and the transitions are abrupt, a thin transition layer will be formed. Clearly, the grain size in the transition layer will be between the grain sizes of the fine-grain and coarse-grain phase change layers 42 and 44.

Figure 8:
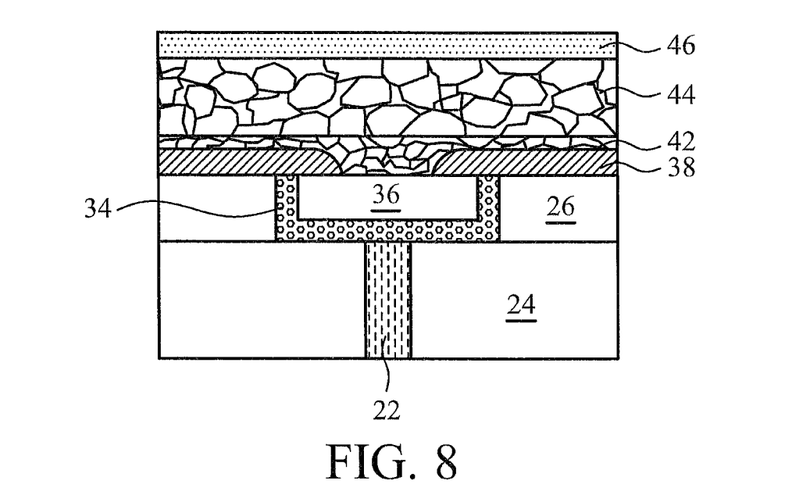

FIG. 8 illustrates the formation of top electrode 46, which may include Ti, TiN, TiW, W, TiAl, TiAlN, Ta, TaN, W, and the like.

Figure 9A:
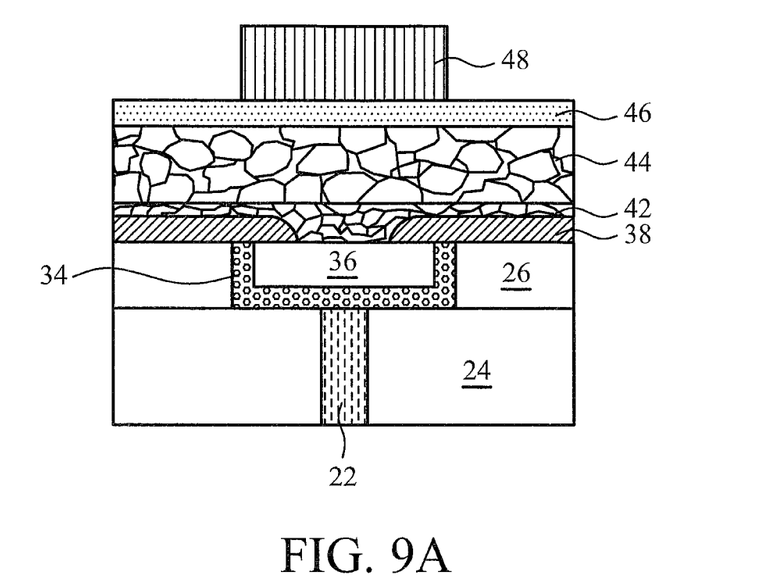

FIG. 9A illustrates the formation of top electrode contact 48, which may be formed of conductive material having low resistivities. A phase change memory cell is thus formed. In FIGS. 6A through 9A, dielectric materials need to be formed to define the boundaries of layers 38, 42, 44, 46, and 48. These dielectric materials are omitted in the drawings. One skilled in the art will realize their formation details.

Figure 9B:
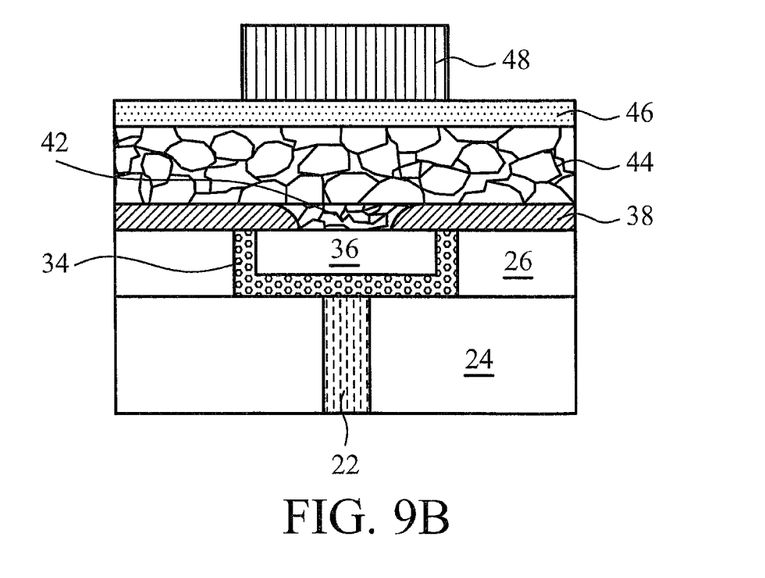
Figure 9C:
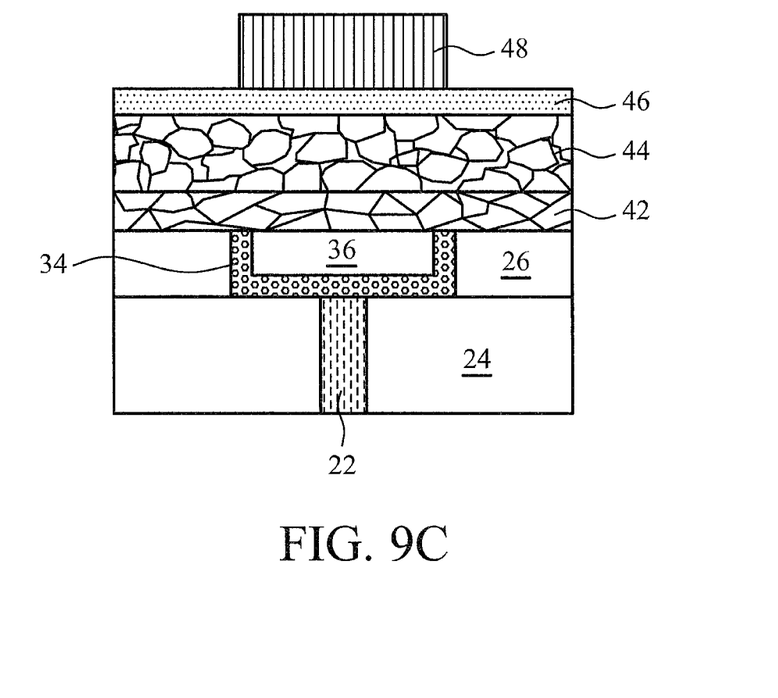
FIGS. 9C, 10, and 11 illustrate cross-sectional views of additional embodiments of the present invention.

FIG. 9B illustrates a resulting memory cell formed based on the structure shown in FIG. 6C, wherein fine-grain phase change layer 42 is limited to the trench defined by dielectric layer 38. In FIG. 9C, no dielectric layer 38 is formed, and thus the interface between fine-grain phase change layer 42 and heater 34 forms a ring.

Figure 10:
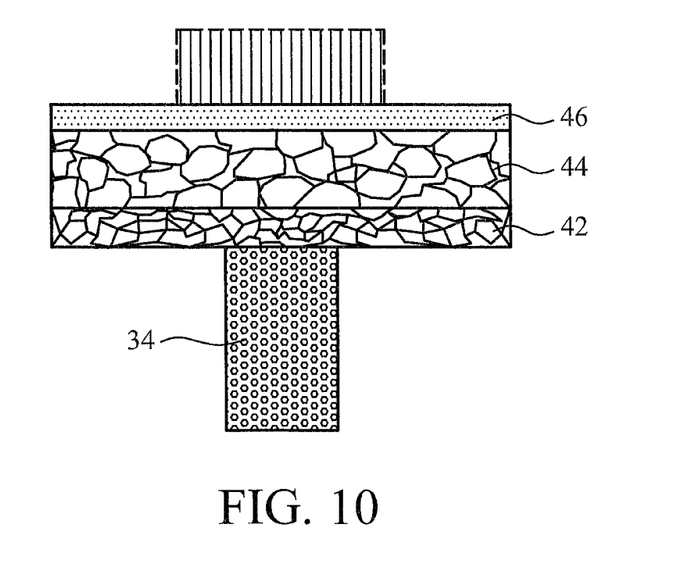
Figure 11:
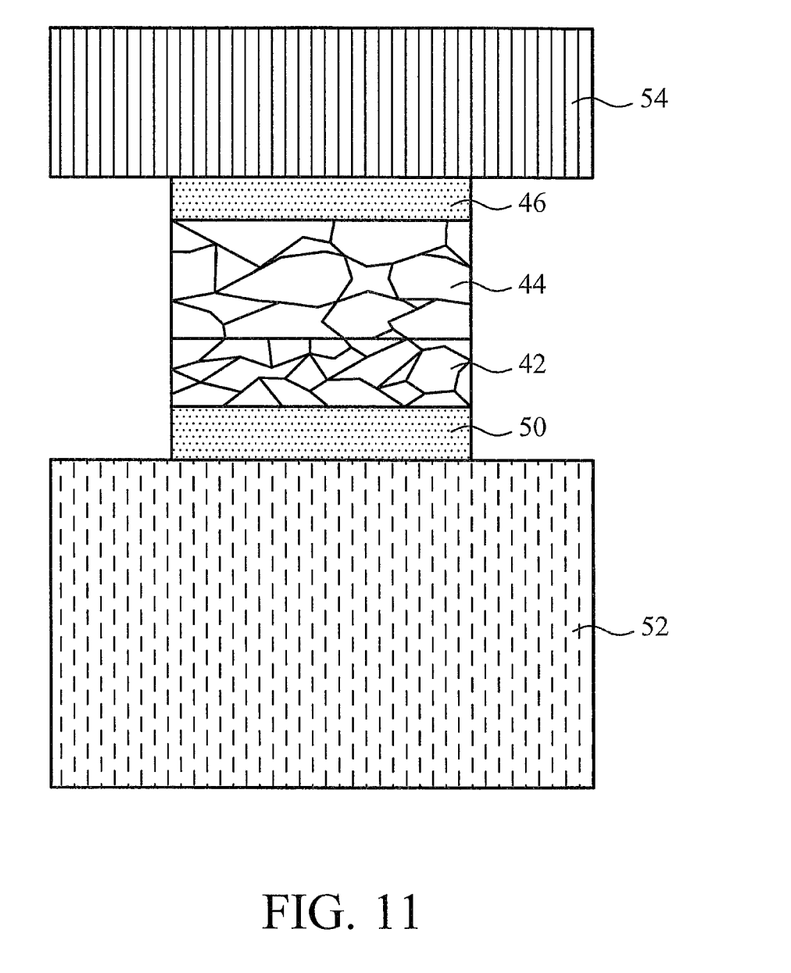

FIG. 10 illustrates a T-shaped memory cell, wherein fine-grain phase change layer 42 is in contact with a pillar-like heater 34. In FIG. 11, bottom electrode 50 is formed under fine-grain phase change layer 42. Bottom electrode 50, fine-grain phase change layer 42, coarse-grain phase change layer 44, and top electrode 46 all have pillar shapes, and are formed between metal lines 52 and 54. One skilled in the art will realize that phase change memory cells may have many different forms.

After the back end of the process is finished, fine-grain phase change layer 42 and coarse-grain phase change layer 44 may have same or different crystalline structures, with each including face-centered cubic (FCC) structure, hexagonal close packed structure (HCP) structure, or combinations thereof. At the HCP state, phase change materials have lower resistivities than at the FCC state. Fine-grain phase change layer 42 is more likely to have more FCC structures than coarse-grain phase change layer 44. It is also likely that fine-grain phase change layer 42 is formed substantially entirely of FCC structures, while coarse-grain phase change layer comprises FCC structures and HCP structures. Advantageously, by forming fine-grain phase change layer 42, the interfacial free energy is increased due to the increased grain boundary area between grains. This causes the transition temperature of the HCP state to be increased. Preferably, the transition temperature is increased higher than the temperatures adopted by the back end of the process. Accordingly, in the resulting phase change memories, fine-grain phase change layers are less likely to be transitioned to the HCP state, and the initial resistivities of the phase change memories are increased. Advantageously, this reduces the required initial reset currents, and hence the difference between the initial reset current and subsequent reset currents.

Simulation has been performed to fabricate three sample memory cells with similar structures, wherein the first and the second samples are formed of coarse-grain and fine-grain phase change materials, while the third sample (an embodiment of the present invention) includes a coarse-grain layer and a fine-grain layer. Simulation results have shown that the first sample needs an initial reset current of about 585 μA, the second sample needs an initial reset current of about 97 μA, while the third sample requires an initial reset current of about 100 μA. Compared to the first sample, the third sample needs a much lower initial reset current. Compared to the second sample, the third sample has the advantageous features of reducing voltage drop on the phase change memory cell due to the existence of coarse-grain phase change layer 44.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device comprising:
    a substrate;
    a phase change element comprising:
        a heater over the substrate; and
        a phase change layer over the heater, wherein an upper portion of the phase change layer has greater average grain sizes than a lower portion of the phase change layer;
        an amorphous phase change region between and physically separating the heater from the lower portion of the phase change layer; and
        a conductive feature over the phase change layer.

2. The memory device of claim 1, wherein a ratio of an average grain size of the upper portion to an average grain size of the lower portion is greater than about two.

3. The memory device of claim 1, wherein the phase change layer is doped with a dopant selected from the group consisting essentially of nitrogen, oxygen, silicon, nitrides, oxides, oxynitrides, and combinations thereof, and wherein the dopant has a higher percentage in the lower portion than in the upper portion.

4. The memory device of claim 1, wherein the upper portion of the phase change layer contacts the conductive feature, and wherein the lower portion of the phase change layer contacts the heater.

5. The memory device of claim 1, wherein the phase change layer comprises GeSbTe.

6. A memory device comprising:
    a substrate;
    a first conductor over the substrate;
    a second conductor over the substrate; and
    a phase change element between the first and the second conductors, wherein the phase change element comprises:
        a first sub layer adjoining the first conductor, wherein the first sub layer has a first average grain size;
        a second sub layer adjoining the second conductor and comprising a portion overlapping the first sub layer, wherein the second sub layer has a second average grain size greater than the first average grain size, and wherein a ratio of the second average grain size to the first average grain size is greater than about two, and wherein the first sub layer has a horizontal dimension smaller than a respective horizontal dimension of the second sub layer; and
        a transition layer between the first and the second sub layers and having gradually increased average grain sizes, wherein upper portions of the transition layer have greater average grain sizes than lower portions of the transition layer.

7. The memory device of claim 6, wherein the second conductor is over the first conductor, and wherein the second sub layer is over the first sub layer.

8. The memory device of claim 6, wherein the first average grain size is between about 3 nm and about 10 nm, and wherein the second average grain size is between about 6 nm and about 20 nm.

9. The memory device of claim 6, wherein the first and the second sub layers are doped with a dopant selected from the group consisting essentially of nitrogen, oxygen, silicon, nitrides, oxides, oxynitrides, and combinations thereof, and wherein the dopant has a higher percentage in the first sub layer than in the second sub layer.

10. The memory device of claim 6, wherein the first sub layer comprises substantially face-centered cubic (FCC) structures, and is substantially free from hexagonal close packed (HCP) structures, and wherein the second sub layer comprises a combination of FCC structures and HCP structures.

11. The memory device of claim 6, wherein each of the first and the second sub layers comprises a combination of FCC structures and HCP structures, and wherein the first sub layer has a higher percentage of FCC structures than the second sub layer.

12. A memory device comprising:
    a semiconductor substrate;
    a conductive feature over the semiconductor substrate;
    a dielectric layer over the conductive feature;
    a trench in the dielectric layer, wherein the conductive feature has at least a portion exposed through the trench; and
    a phase change element comprising:
        a phase change layer having a first portion extending into the trench, wherein the first portion has a first average grain size;
        a middle portion over the first portion, wherein the middle portion has gradually increased average grain sizes; and
        a second portion over the dielectric layer and the middle portion, wherein the second portion has a second average grain size greater than about two times the first average grain size.

13. The memory device of claim 12, wherein the second portion has a width greater than a respective width of the trench.

14. The memory device of claim 12, wherein the trench has a width smaller than about 500 Å.

15. The memory device of claim 12 further comprising an amorphous phase change region between and contacting the first portion and the conductive feature.

16. The memory device of claim 12, wherein the first average grain size is between about 3 nm and about 10 nm, and wherein the second average grain size is between about 6 nm and about 20 nm.

17. The memory device of claim 12, wherein the first and the second portions are doped with a dopant selected from the group consisting essentially of nitrogen, oxygen, silicon, nitrides, oxides, oxynitrides, and combinations thereof, and wherein the dopant has a higher percentage in the first portion than in the second portion.

18. The memory device of claim 12, wherein the phase change element comprises GeSbTe.

* * * * *